United States Patent
Gierl et al.

(10) Patent No.: US 9,534,852 B2
(45) Date of Patent: Jan. 3, 2017

(54) MOUNTING SYSTEM FOR FLUID HEAT EXCHANGE SYSTEMS

(71) Applicant: COOLIT SYSTEMS, INC., Calgary (CA)

(72) Inventors: Brydon Gierl, Calgary (CA); Geoff Sean Lyon, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 509 days.

(21) Appl. No.: 14/080,541

(22) Filed: Nov. 14, 2013

(65) Prior Publication Data

US 2014/0131007 A1 May 15, 2014

Related U.S. Application Data

(60) Provisional application No. 61/726,386, filed on Nov. 14, 2012.

(51) Int. Cl.
*F28F 9/007* (2006.01)
*F28D 15/00* (2006.01)
*H01L 23/473* (2006.01)

(52) U.S. Cl.
CPC ............... *F28F 9/007* (2013.01); *F28D 15/00* (2013.01); *F28F 2250/08* (2013.01); *F28F 2275/22* (2013.01); *H01L 23/473* (2013.01); *H01L 2924/0002* (2013.01)

(58) Field of Classification Search
CPC F28F 2280/00; F28F 2280/06; F28F 2280/02; F28F 2275/22; H01L 23/40; F28D 15/00
USPC ..................................... 165/80.1, 68, 79, 67
See application file for complete search history.

(56) References Cited

U.S. PATENT DOCUMENTS

| 4,190,879 | A | * | 2/1980 | Tissot | H05K 7/2049 200/61.45 M |
|---|---|---|---|---|---|
| 4,484,682 | A | * | 11/1984 | Crow | A45C 11/20 206/541 |
| 8,944,148 | B2 | * | 2/2015 | Hawwa | F28F 3/02 165/185 |
| 8,952,774 | B2 | * | 2/2015 | Dolgonos | F28F 9/007 165/67 |
| 2008/0149321 | A1 | * | 6/2008 | Tien | F28D 15/02 165/185 |
| 2009/0084522 | A1 | * | 4/2009 | Foglieni | F24D 19/02 165/67 |
| 2012/0014068 | A1 | * | 1/2012 | Nakanishi | H01L 23/10 361/717 |

(Continued)

FOREIGN PATENT DOCUMENTS

JP WO 9202117 A1 * 2/1992 ............. H01L 23/40

*Primary Examiner* — Tho V Duong
(74) *Attorney, Agent, or Firm* — Ganz Pollard, LLC

(57) ABSTRACT

A heat exchange system can include a heat exchange unit and a magnetic element. The heat exchange unit can have a housing and a heat exchange surface configured to thermally couple to a subject of heat exchange. The housing can define an outer surface spaced apart from the heat exchange surface. A magnetic element, a ferrous element, or both, can be positioned within the housing. A coupling agent can have a complementary magnetic element, ferrous element, or both. The coupling agent can interact with the magnetic element, the ferrous element, or both, positioned within the housing. The coupling agent can be coupled to a substrate to retain the heat exchange unit relative to the substrate.

16 Claims, 8 Drawing Sheets

(56) References Cited

U.S. PATENT DOCUMENTS

2012/0120608 A1\* 5/2012 Guan ................ H01L 23/40
361/704

\* cited by examiner

MOUNTING SYSTEM FOR FLUID HEAT EXCHANGE SYSTEMS

RELATED APPLICATIONS

This application claims the benefit of and priority to U.S. Patent Application No. 61/726,386, filed Nov. 14, 2012, the contents of which are hereby incorporated by reference, as if recited in full herein, for all purposes.

BACKGROUND

The innovations and related subject matter disclosed herein (collectively referred to as the "disclosure") generally pertain to fluid heat exchange systems. Some systems are described in relation to electronics cooling applications by way of example, though the disclosed innovations may be used in a variety of other applications. More particularly, the innovations and related subject matter relate to mechanical retention systems for retaining a heat exchange component adjacent to a heat-exchange surface of a subject of heat exchange.

Heat sinks, including fluid heat exchangers, are used to cool electronic and other heat dissipating devices by accepting thermal energy (heat) from such a device and dissipating the heat to another medium, as by passing the heat to fluid flowing through or over the heat sink. Some heat exchangers are configured to transfer heat to a device (e.g., an endothermic reaction chamber). Mechanical retainers disclosed herein can be used in connection with either type of heat exchanger.

Despite the existence of many previously proposed heat sinks and fluid heat exchange systems, a need exists for heat exchange systems configured to provide improved thermal performance. As well, a need exists for systems configured for existing and developing small form factors. For example, a need for exists for compact, low-profile heat exchange assemblies (e.g., integrated heat sink and pump assemblies) having a vertical component height of about 27 mm, such as between about 24 mm to about 27.5 mm, or less. Hereinafter, such heat sinks and heat exchange components will, for convenience, be referred to as an "HX unit"

A number of improvements have been recently made in the field, as disclosed, for example, in US patent applications, 61/522,247, filed on Aug. 19, 2011, 60/954,987, filed on Aug. 9, 2007, Ser. No. 12/189,476, filed on Aug. 11, 2008, 61/512,379, filed on Aug. 12, 2011, Ser. No. 13/401, 618, filed on Feb. 21, 2012, and Ser. No. 13/559,340 filed on Jul. 26, 2012, which applications are hereby incorporated by reference in their respective entireties, for all purposes.

As illustrated in FIG. 8, for example, known heat exchange systems 300 typically are configured with retention elements 302, such as integrated flanges that flare off the body of the system. The flanges have holes through which a fastener is placed to mount a housing to a surface holding the subject to be cooled (or heated). The retention elements 302 are arranged to match or otherwise correspond to the arrangement of mounting points on the surface. Taking as a non-limiting example the case of a CPU that is to be cooled, the CPU will be mounted on a motherboard or other such circuit board. The fastening points for the HX unit will be predetermined and specified by the manufacturer of the board or another party. Because a great variety of CPUs and their boards exist, the manufacturers of HX units usually must design their HX units to have retention elements that match (or correspond to) the mounting patterns on the mounting surfaces. Disadvantageously, this increases tooling costs for HX units and creates assembly inefficiencies.

Although some prior art HX units have been retained in an operable position by a separable retention element, known separable retention elements have been cumbersome to install. For example, an installer typically has needed to hold the HX unit and the separable retention element in position while engaging a plurality of fasteners (each of which usually requires the use of a tool to engage the fastener).

Accordingly, a need exists for a mounting system that allows a given HX unit design to be retained to each of a plurality of patterns of mounting points, or having differing mounting systems of the same pattern, e.g., varying screw diameters, snap-fit connectors instead of screw receptacles, etc.

SUMMARY

The innovations disclosed herein overcome many problems in the prior art and address the aforementioned, as well as other needs. The innovations disclosed herein pertain generally to fluid heat exchange systems and more particularly, but not exclusively, to couplers for integrating components in such systems. For example, some innovations are directed to innovative coupler designs, including assemblies of a coupling agent and a low-profile HX unit. The coupling agent facilitates urging of a HX unit against a subject of heat exchange for thermally coupling the HX unit to the subject of heat exchange. Other embodiments are directed to one or more structural and other configuration aspects of the coupler, while other embodiments pertain to the assembly of the coupling agent, the heat exchange system, and the surface structure and features onto which the coupling agent and heat system can be coupled. And, still other innovations pertain to approaches for eliminating system components while retaining their respective functions.

In certain embodiments, the innovative subject matter is directed to a coupling agent for coupling a compact, low profile heat exchange unit (HX unit) to a mounting surface, the coupling agent comprising: a construct configured to couple the HX unit to the mounting surface and to immobilize the HX unit in place over a subject of thermal exchange (e.g., to thermally couple the HX unit to an operative electronic component) without any intermediate part connecting the coupling agent to the HX unit. In some embodiments, the construct comprises an encagement structure having a topside generally disposed in a horizontal plane and one or more vertical spacers downwardly extending from the topside, the topside and the vertical spacer generally defining an internal region suitable for receiving the HX unit (e.g., in a mating engagement); a retention element coupled to or otherwise disposed on the vertical spacer for interacting with a corresponding area on a mounting surface (or other region on, for example, a motherboard); wherein the topside of the coupling agent is configured to urge against a corresponding region defined by the topside of the HX unit, and, by securing the coupling agent to the mounting surface, the HX unit is immobilized in place In certain embodiments, the heat exchange system may be a compact, low-profile HX unit having one or more of the following characteristics: a heat-spreader plate including an intended heat generating component contact region; a plurality of microchannels for directing heat transfer fluid over the heat spreader plate, and each of the plurality of microchannels having a continuous channel flow path between their first end and their opposite end; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends, the fluid inlet opening and the first and opposite fluid outlet openings providing that any flow of heat transfer fluid that passes into the plurality of microchannels, flows along the full length of each of the plurality of microchannels in two directions outwardly from the fluid inlet opening. Some described heat exchange systems have a heat sink with a plurality of juxtaposed fins defining a corresponding plurality of microchannels between adjacent fins, and a recessed groove extending transversely relative to the fins. A manifold body at least partially defines an opening generally overlying the groove. The heat sink can have a heat spreader, with each of the fins extending from the heat spreader. The fins and the heat spreader can form a unitary construction, in some heat sink embodiments.

In certain embodiments, the HX unit can be coupled or affixed to a substrate surface (herein referred to as a "mounting surface") using an independent coupling agent configured to receive a portion of the HX unit and to immobilize the HX unit relative to the subject of heat exchange (e.g., to maintain a sound thermal coupling between the HX unit and the subject of heat exchange). The coupling agent eliminates the need for the HX unit itself to have integrated features for directly fastening to the mounting surface. In such an embodiment, only the coupling agent need be physically connected to the mounting surface by, e.g., mechanical fasteners (e.g., threaded fasteners, rivets, snap fits, hook-and-loop fasteners, etc.), welds, chemical bonds, adhesives, magnetic couplings, etc. The coupling agent can be configured to interact with the HX unit and retain it (e.g., in a mating engagement, in a magnetic engagement, or both, as in FIG. 4). In other embodiments the HX unit and coupling agent may be configured with complementary elements that allow for a supplemental coupling between the HX unit and the coupling agent, such as, for example, a physical connection using one or more of the following: threaded fasteners, rivets, snap fits, hook and loop fasteners, adhesives, etc. Advantageously, the coupling agent can immobilize the HX unit to the mounting surface without any intermediate parts for connecting the coupling agent to the HX unit and/or the HX unit to the mounting surface.

It is to be understood that other innovative aspects will become readily apparent to those skilled in the art from the following detailed description, wherein various embodiments are shown and described by way of illustration. As will be realized, other and different embodiments are possible and several details are capable of modification in various other respects, all without departing from the spirit and scope of the principles disclosed herein.

Accordingly the drawings and detailed description are to be regarded as illustrative in nature and not as restrictive.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several aspects of the presently disclosed principles are illustrated by way of example, and not by way of limitation, in detail in the drawings, wherein.

DETAILED DESCRIPTION

FIGS. 1-5 and 9 show select embodiments of the innovative and related subject matter disclosed herein. The following describes various innovative principles related to heat exchange systems by way of reference to specific examples. However, one or more of the disclosed principles can be incorporated in various system configurations to achieve any of a variety of corresponding system characteristics. The detailed description set forth below in connection with the appended drawings is intended as a description of various embodiments and is not intended to represent the only embodiments contemplated by the innovative subject matter and principles. The detailed description includes specific details for the purpose of providing a comprehensive understanding of the principles disclosed herein. However, it will be apparent to those skilled in the art after reviewing this disclosure that one or more of the claimed inventions may be practiced without one or more of the illustrated details.

Stated differently, systems described in relation to particular configurations, applications, or uses, are merely examples of systems incorporating one or more of the innovative principles disclosed herein and are used to illustrate one or more innovative aspects of the disclosed principles. Thus, heat exchange systems and coupling agents therefor having attributes that are different from those specific examples discussed herein can embody one or more of the innovative principles, and can be used in applications not described herein in detail, for example to transfer heat to or from components in a data center, laser components, light-emitting diodes, chemical reactions, photovoltaic cells, solar collectors, electronic components, power electronics, opto-electronics (e.g., used in switches) and a variety of other industrial, military and consumer devices now known or hereafter developed. Accordingly, such alternative embodiments also fall within the scope of this disclosure.

Figure 7:
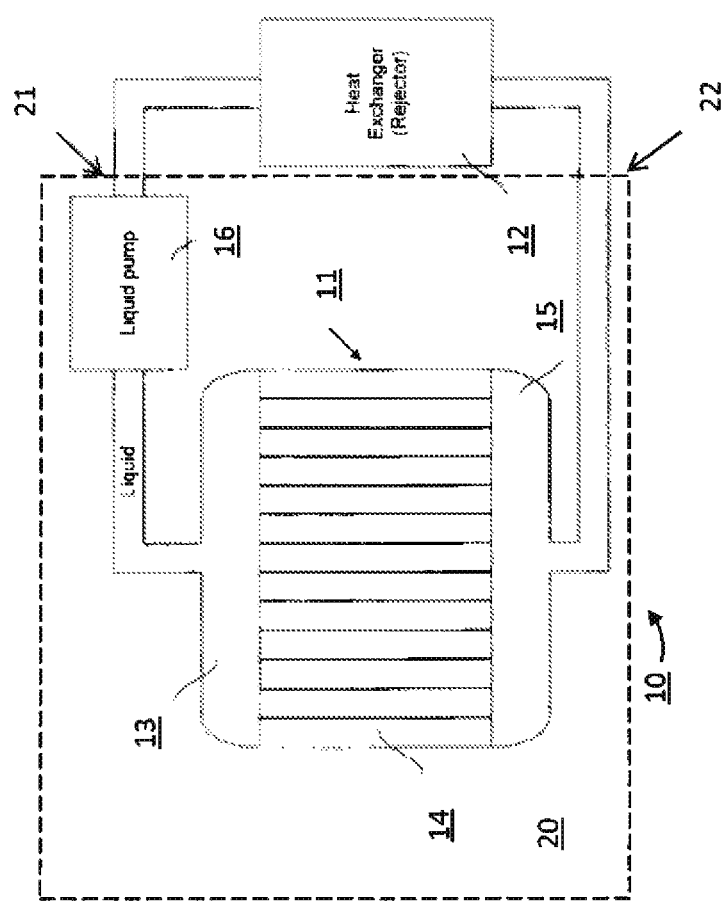
FIG. 7 shows a fluid circuit configured to transfer heat from one region to another with a circulating working fluid.

The schematic illustration in FIG. 7 shows several functional features common among disclosed fluid-based heat exchanger systems. For example, the fluid circuit 10 has a first heat exchanger 11 configured to absorb heat from a heat source (not shown in FIG. 7) and a second heat exchanger 12 configured to reject heat from the circuit 10. As indicated in FIG. 7, a working fluid, or coolant, can circulate between the heat exchangers 11, 12 to carry the energy absorbed by the working fluid in the first heat exchanger to the second heat exchanger 12 where energy can be rejected from the fluid. One or both of the heat exchangers 11, 12 can be a microchannel heat exchanger.

As used herein, "microchannel" means a fluid conduit, or channel, having at least one major dimension (e.g., a channel width) measuring less than about 1 mm, such as, for example, about 0.1 mm, or several tenths of millimeters.

As used herein, "fluidic" means of or pertaining to a fluid (e.g., a gas, a liquid, a mixture of a liquid phase and a gas phase, etc.). Thus, two regions that are "fluidicly coupled" are so coupled to each other as to permit a fluid to flow from one of the regions to the other region in response to a pressure gradient between the regions.

As used herein, the terms "working fluid" and "coolant" are interchangeable. Although many formulations of working fluids are possible, common formulations include distilled water, ethylene glycol, propylene glycol, and mixtures thereof.

As used herein, the terms "heat sink" and "heat exchanger" and "HX unit" are interchangeable and mean a device configured to transfer energy to or from a fluid through convection (i.e., a combination of conduction and advection) heat transfer.

Referring again to FIG. 7, the working fluid typically enters a first manifold 13 (sometimes after passing through an inlet plenum, which is omitted from FIG. 7 for ease of illustration). From the manifold 13, the fluid can be distributed among a plurality of fluid passages 14 configured to transfer heat from a heat-transfer surface, e.g., a wall in the heat exchanger 11, to the working fluid. In some embodiments, the fluid passages 14 are configured as microchannels and the walls are configured as extended heat-transfer surfaces, or fins.

During operation of the circuit 10 to cool a heat-generating component or other subject of thermal exchange, energy conducts (e.g., diffuses) from the walls of the first heat exchanger into adjacent fluid particles within the passages 14, and the adjacent fluid particles are swept away from the wall, or advected, carrying the energy absorbed from the walls. The swept-away particles are replaced by other, usually cooler fluid particles, which more readily absorb energy from the walls (e.g., by virtue of their usually lower temperature). Such a combination of conduction and advection (i.e., convection) provides an efficient approach for cooling devices having a relatively high heat flux, such as, for example, electronic devices.

After passing through the plurality of passages 14 in the first heat exchanger 11, the heated working fluid collects in an exhaust manifold 15 and passes to the second heat exchanger 12, carrying with it the energy absorbed from the first heat exchanger 11. As the heated fluid passes through the second heat exchanger 12, energy is rejected from the fluid (e.g., to another working fluid, such as, for example, the air or a building's water supply) through convection processes similar to those described above. From the second heat exchanger, the cooled working fluid passes through a pump 16 and back to the first heat exchanger 11.

Figure 6:
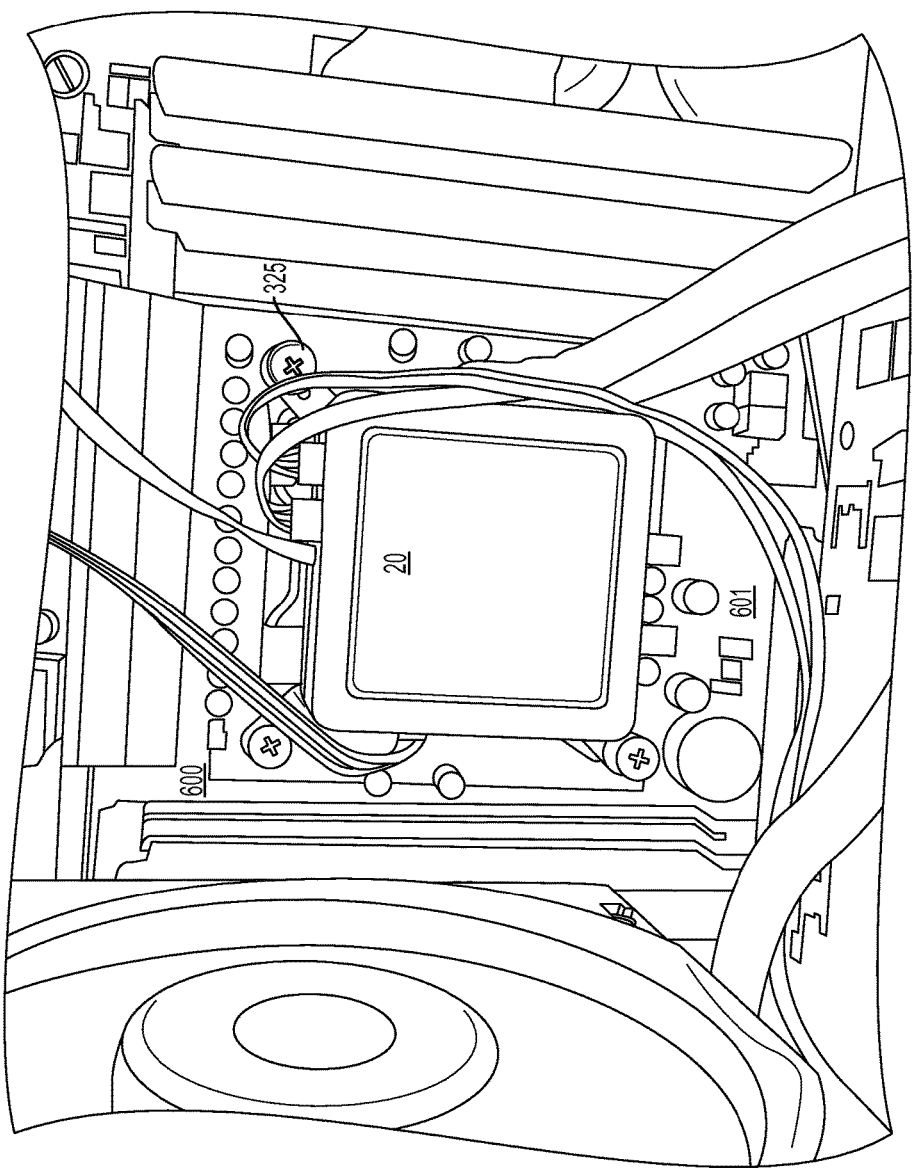
FIG. 6 shows a HX unit mounted to a motherboard in a conventional manner and thermally coupled to a subject (not visible) of heat exchange (i.e., a microprocessor package)

The dashed box in FIG. 7 indicates that several functional components of the circuit 10 can be integrated into a single subassembly. As an example, the HX unit 20 includes the pump 16, the manifolds 13, 15 and the passages 14, as well as, for example, conduits between the pump and the manifold 13. An inlet 21 and an outlet 22 operatively couple the subassembly 20 to the second heat exchanger 12. A working embodiment of such a subassembly 20 is described below in connection with FIG. 8 which includes an integrated retention mechanism 302 on the body of HX unit 300 (as shown in FIG. 6).

Figure 8:
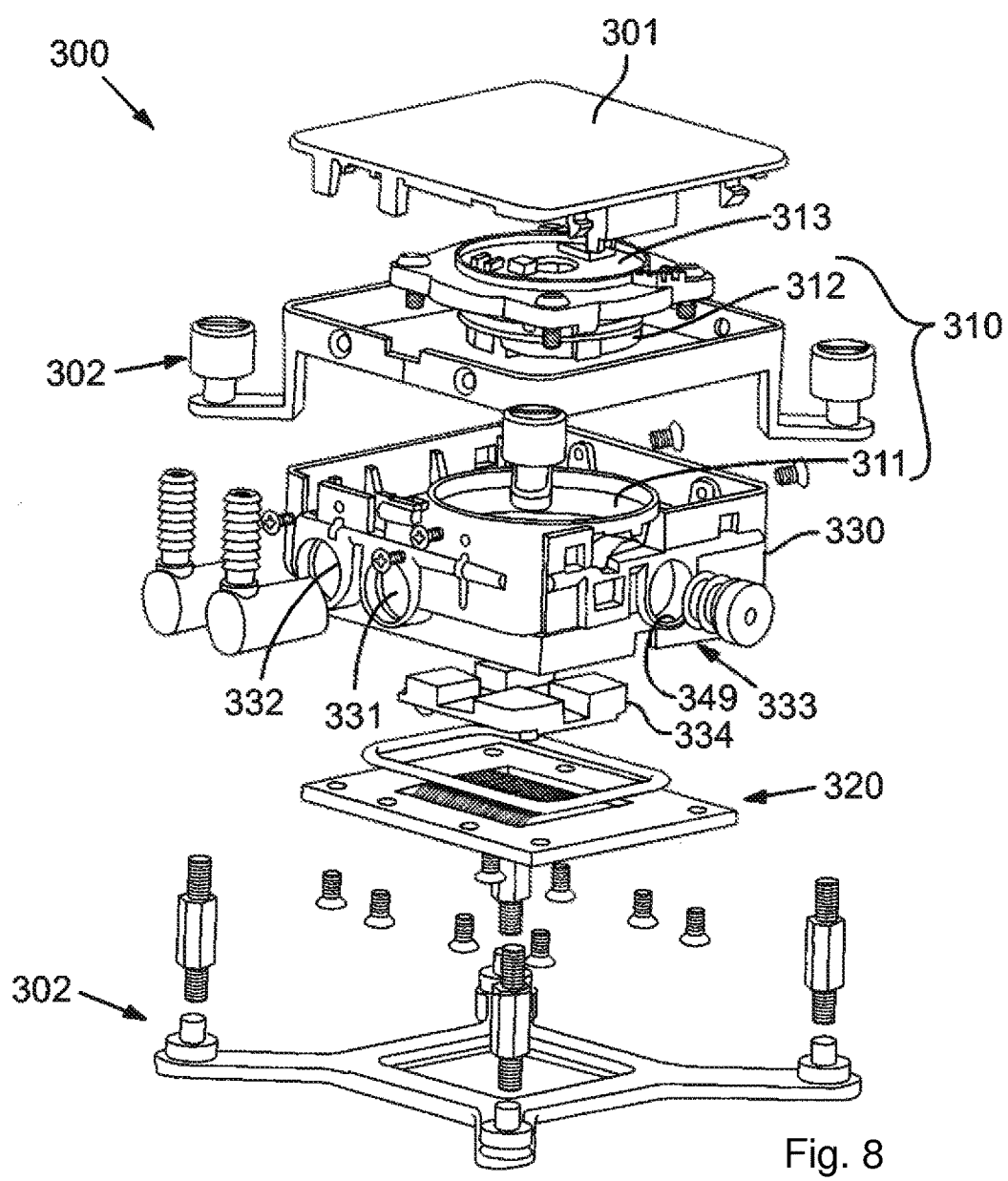
FIG. 8 illustrates an exploded view of an embodiment of an integrated pump and heat exchanger assembly.

Referring to FIG. 8, a working example of an HX unit 20 (300) is described. The illustrated subassembly 300 comprises a pump 310 (e.g., 312 and 313, exclusive of retention mechanism 302) and a heat exchanger 320, as well as housing 330 with integrated fluid conduits extending therebetween. The subassembly 300 is but one example of an approach for integrating several elements of the fluid circuit 10 shown in FIG. 8 (e.g., the pump 16 and the first heat exchanger 11, including the inlet manifold 13, the fluid passages 14, the exhaust manifold 15) into a single element while retaining the several elements' respective functions. The illustrated housing 330 is configured to convey a working fluid from an inlet port 331 to a pump volute 311, from the pump volute to an inlet to the heat exchanger 320, and from an outlet of the heat exchanger to an outlet port 332.

The pump impeller 312 can be received in the pump volute 311. The impeller can be driven in rotation by an electric motor 313 in a conventional manner. A cap 301 can overlie the motor 313 and fasten to the housing 330 to provide the subassembly 300 with a finished appearance suitable for use with, for example, consumer electronics.

The side 333 of the housing 330 positioned opposite the pump volute 311 can receive a manifold insert 334 and the heat exchanger 320. A seal (e.g., an O-ring) 323 can be positioned between the housing 330 and the heat exchanger 320 to reduce and/or eliminate leakage of the working fluid from the interface between the heat exchanger 320 and the housing 330.

The heat exchanger 320 includes a lower-most face of the assembly 300, as well as a surface configured to thermally couple to subject for thermal coupling, such as an integrated circuit (IC) package (not shown). In the example of FIG. 8, the heat exchanger includes integrated retention elements 302 that can mechanically couple the assembly to a mounting surface, such as a printed circuit board to which an IC package is assembled. The retention elements 302 in this example form part of the body of the HX unit 300. They connect to the mounting surface by mechanical fasteners placed through the corner flanges seen in FIG. 8.

Figure 4:
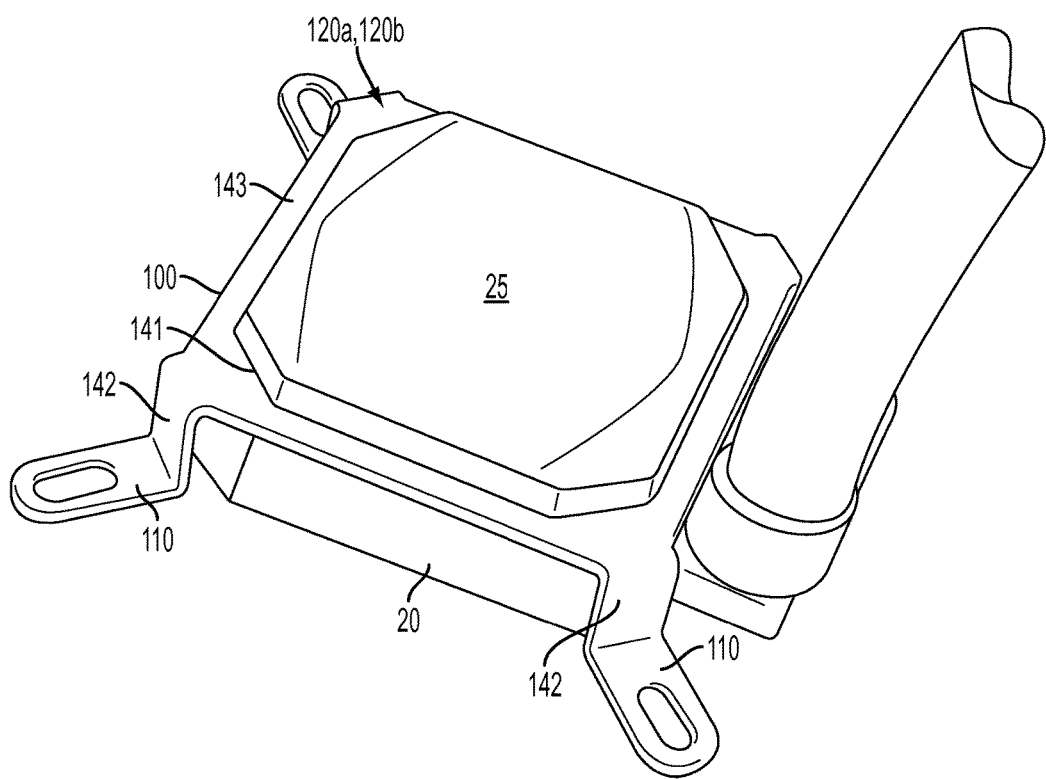
FIG. 4 shows the heat exchange unit and coupling agent of FIG. 3 assembled together.
Figure 5:
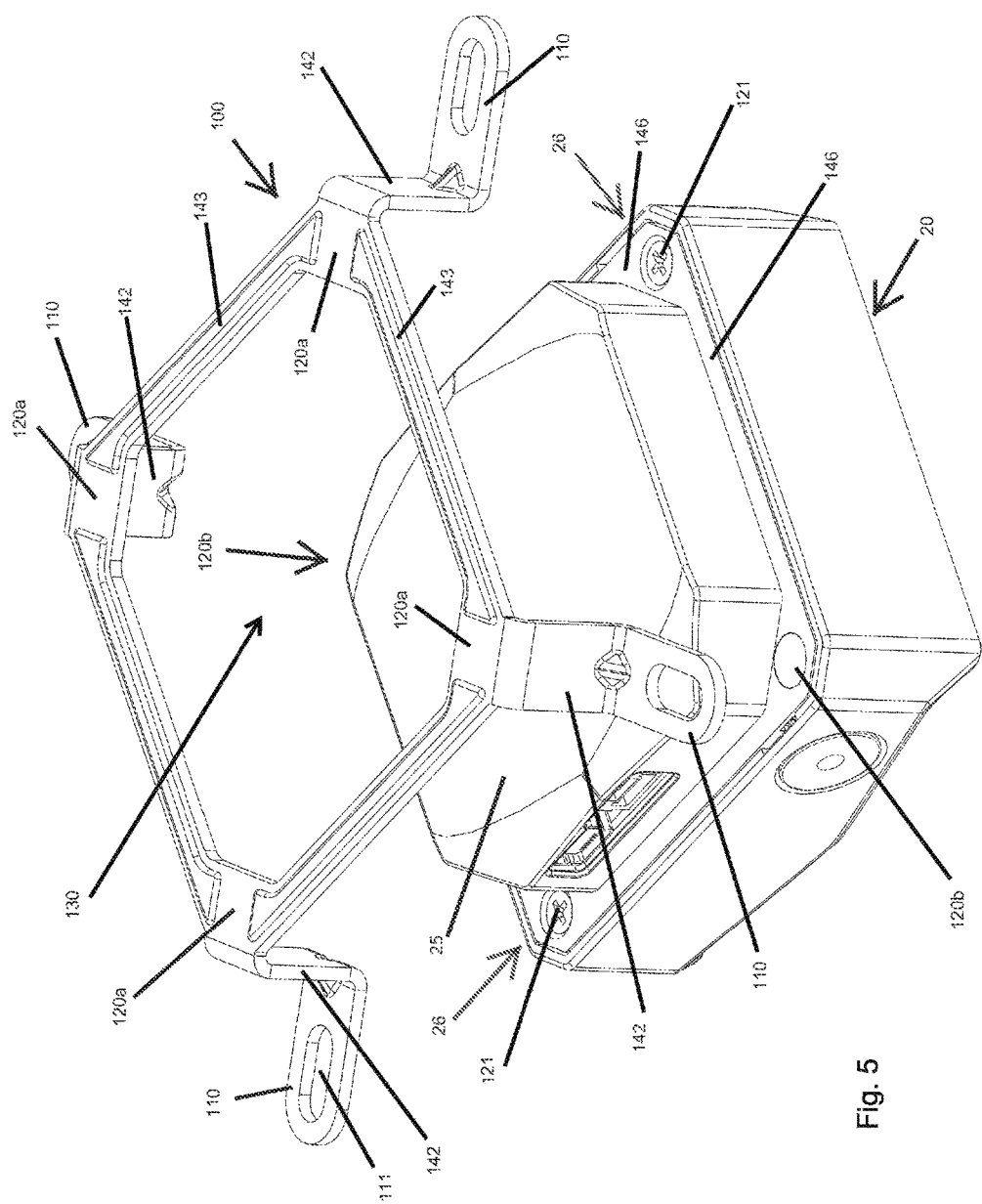
FIG. 5 shows an exploded view of the assembly pictured in FIG. 4.

As shown in FIG. 6, the HX unit 20 is mounted to a substrate (hereinafter referred to as a "mounting surface" 600) using fastener 302 extending through apertures in integrated retention elements. In certain embodiments, as shown in FIGS. 4 and 5, an independent (or separable) construct can define retention elements, 110 such as a coupling agent 100, 200 that receives a portion of the HX unit 20 and is capable of immobilizing the HX unit relative to the subject of heat exchange (not shown) on the surface 600. The coupling agents 100, 200 shown by way of example in FIGS. 1 and 2 can eliminate the need for the HX unit 20 itself to have integrated features (e.g., integrated elements through which the fasteners 302 extend as shown in FIG. 8) for directly fastening to the mounting surface. Instead, the coupling agents 100, 200 can be physically connected to the mounting surface by a physical coupling (mechanical fasteners, e.g., threaded fasteners, rivets, snap fits, hook-and-loop fasteners, etc.), welds, chemical bonds, adhesives, magnetic couplers, etc. Accordingly, the disclosed coupling agents form constructs configured to interact with the HX unit 20 and to retain it. In other embodiments, the HX unit 20 and coupling agent 100, 200 may be configured with complementary elements that allow for physical interconnection, mating engagement, or both, using, for example, threaded fasteners, rivets, snap fits, hook and loop fasteners, adhesives, magnetic couplers, etc. Advantageously, in some embodiments, the coupling agent 100, 200 can immobilize the HX unit 20 relative to the mounting surface without any intermediate, separate parts for connecting the coupling agent to the HX unit and/or the HX unit to the mounting surface.

Turning now to FIGS. 1-5 and 9, according to certain embodiments and principles of the innovative subject matter, the coupling agent 100, 200 and the HX unit 20 can be complementarily configured. For example, the HX unit 20 and coupling agent 100, 200 can be configured to matingly engage with each other as shown in FIG. 4. A supplemental coupling 120a, 120b can retain the coupling agent and the HX unit in a subassembly configuration, e.g., for ease of handling before and during installation of the HX unit in a system (e.g., before and during thermally coupling the HX unit to a subject of thermal exchange). The supplemental coupling 120a, 120b can comprise a ferromagnetic alloy 120a and a suitable magnet 120b. For example, at least a portion of the coupling agent 100, 200 can comprise a ferrous material 120a and the HX unit 20 can comprise a magnet 120b so positioned as to permit the magnet to draw or otherwise urge the coupling agent 100, 200 toward the HX unit 20, as when the coupling agent and the HX unit are matingly engaged. Notably, the coupling agent 100, 200 and the HX unit 20 need not be physically fastened to each other by mechanical fasteners, welds, chemical bonds or other discrete intermediate part or material spanning through, or disposed between, the HX unit and the coupling agent, though such supplemental retainers are possible and contemplated innovations disclosed herein.

In select, exemplary embodiments, the coupling agent 100, 200 may be a construct defining a region 130 that receives the HX unit 20 in a complementary fit. FIGS. 1-5 show constructs in the nature of an encagement structure defining a receiving region 130 for receiving an HX unit 20. In these examples, the encagement structure is a framework having a topside 140 defining an aperture 141 complementarily configured relative to a portion of an HX unit. The aperture 141 is generally disposed in a horizontal plane. The topside 140 has interconnected vertical supports 142 that extend downwardly from the topside. In this example, the framework for the topside 140 has four side sections 143 forming a generally square shape. The vertical spacers 142 define a vertical spacing and partially define a boundary of a volume for receiving an HX unit 20. The spacers 142 may also define a spacing of the topside 140 above a mounting surface. Four legs, each with an associated retention element 110, extend downwardly from each corner of the topside 140, in the particular embodiment 100 shown in FIG. 1. Two legs, each with an associated retention element 110, extend downwardly from opposed side sections of the topside 140 in the particular embodiment 200 shown in FIG. 2.

The retention elements 110 are positioned adjacent a lower (e.g., distal) end of each leg 142 and are configured to correspond with a mounting feature positioned on or below, or extending through, a mounting surface 600 (e.g., to "interact with the mounting surface"). In the example shown, each retention element 110 is configured as a horizontally extending flange defining a corresponding a slot or other aperture 111. Such a slot or aperture 111 can receive a mechanical fastener, such as a threaded screw or bolt, which in turn is configured to matingly engage a complementary receptacle positioned on or below, or extending through, a mounting surface 600. The legs 142 and associated retention elements 110 are configured in size and shape to match and interact with a corresponding set of retention elements on a predetermined mounting surface 600. As another example, the coupling agent 100, 200 need not have a flange as a retention element. Instead, the legs or other vertical spacers 142 for the coupling agent could have fasteners, or receptacles for fasteners, that are integrated along the longitudinal axis of the leg, and which interact with a complementary retention element on the mounting surface 600.

As described above and shown in FIGS. 1 through 5, the legs 142 on the encagement structure are interconnected by side sections 143. The side sections 143 are shown extending perpendicularly between the legs 142. However, relative to the plane of the mounting surface 600 the side sections 143 could extend in another direction, e.g., in horizontal plane or in both horizontal and perpendicular planes. If the side sections 143 are oriented in a vertical plane relative to the mounting surface 600, they could also serve as the vertical spacers 142, e.g., define a wall-like structure. The width of the side portions may be varied to suit the application (e.g., to provide a suitable retention force or stiffness relative to a mass of a corresponding HX unit 20 exposed to a threshold acceleration or other mechanical vibration). The side sections 143 can form full sides or walls of the encagement structure (i.e., there is a merger of the legs into a side of the encagement structure). The side sections 143 can be uninterrupted surfaces or they may be interrupted surfaces, e.g., surfaces with perforations or other cutouts, a plurality of parallel elements, etc.

In the embodiments shown, the corners 145 of the encagement structure are spaced apart to be slightly larger but closely matching the dimensions of the HX unit 20. The side sections 143 have a width to urge against a corresponding portion 146 of the HX unit 20 to retain the HX unit (e.g., so the HX unit does not push through, for example, a plane defined by the topside 140 (or other perimeter defining features) of the encagement structure). When the assembly of the encagement structure 100, 200 and HX unit 20 are placed on the mounting surface 600, and the retention elements 110 are engaged (e.g., threaded fasteners inserted through the retention elements 110 on the encagement structure and into threaded receptacles on the mounting surface), the encagement structure captures the HX unit 20 in a mating engagement with the mounting surface. Thereby the HX unit 20 is immobilized over the subject on the mounting surface (e.g., surface on heat exchanger 320 (FIG. 8)) that is to be thermally coupled to the downward-facing heat-exchange surface on the HX unit 20.

Generally it is undesirable for the HX unit 20 to have any free-play within the encagement structures 100, 200 once the encagement structure is coupled to the mounting surface 600. Accordingly, the legs 142 of the encagement structure can have a length less than a height of the portions 146 of the HX unit against which the encagement structure urges. With such a configuration, the legs 142 can remain under tension when the retention elements 110 are affixed to a mounting surface 600, as in a manner described above.

As shown in FIGS. 1-6, the top side 140 of the coupling agent 100, 200 may have an aperture 141 that allows for a protruding section 25 of the HX unit 20 to extend above. The aperture 141 has a complementary shape to the protruding top portion 25 and can engage it to enhance a lateral immobilization of the HX unit 20.

Figure 2:
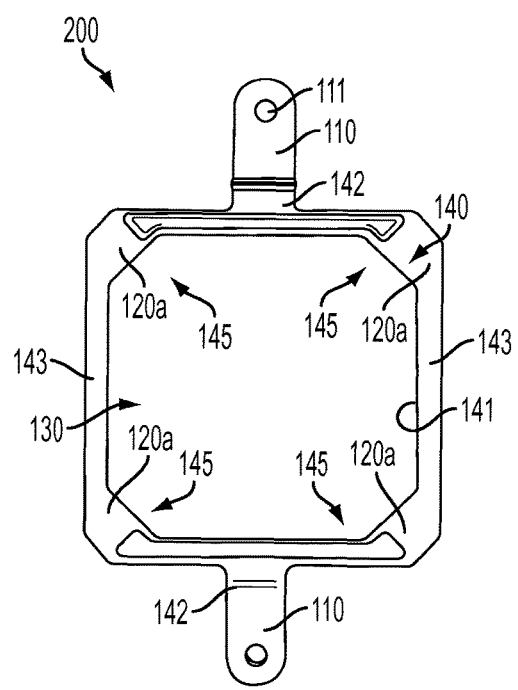
FIG. 2 shows a top view of an alternative embodiment of a coupling agent for coupling the same predetermined heat exchange unit to a different mounting surface.
Figure 3:
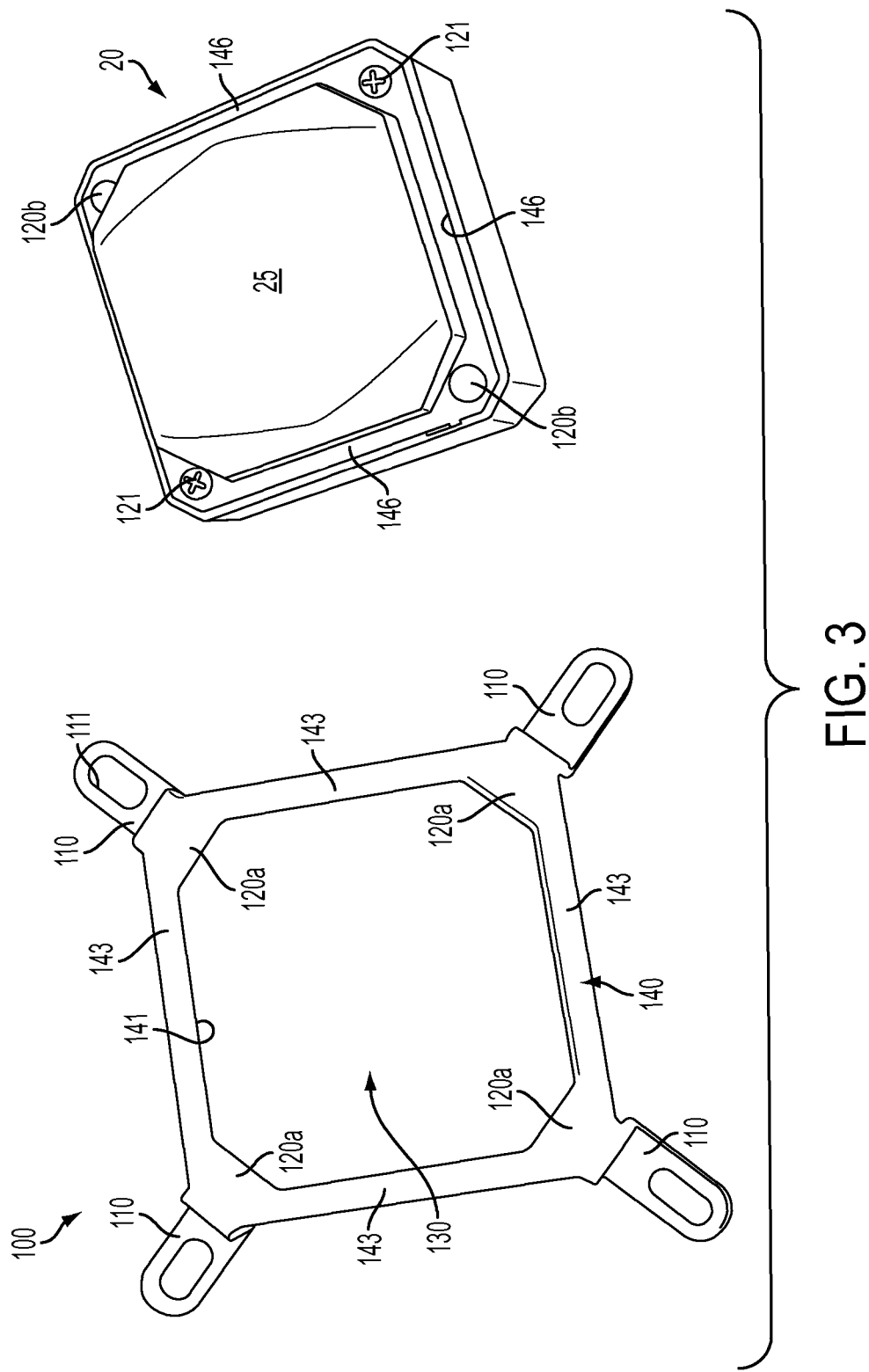
FIG. 3 shows the coupling agent of FIG. 1 adjacent to a heat exchange unit.

In other embodiments, as noted above, the coupling agent 100, 200 need not have discrete legs 142 at each corner 145 to support the topside 140 of the HX unit 20 above the mounting surface 600 or to define the areas for receiving the HX unit. Instead of discrete legs 142 at one or more of the corners 145, full or partial side walls of a predetermined vertical height may be used at one or more of the sides to create a vertical spacing for the top surface 140, as shown in FIG. 2.

Further, the shape of the HX unit 20 need not be rectilinear; it can be most any desired shape. For example, it could have a circular or other curvilinear form or an irregular rectilinear or curvilinear form. Any form of the HX unit 20 could be supported by one or more vertical supports 142 spaced appropriately underneath a top surface 140 to create a vertical spacing above a mounting surface 600 and for receiving the HX unit 20.

To facilitate the process of assembling the HX unit 20 to a mounting surface 600, the innovations disclosed herein contemplate mechanisms and processes for assembly of the coupling agent to the HX unit to create a single unit that is attached to the mounting surface. Thereby, only a single assembly operation needs to be performed on the mounting surface. In the case of motherboards 601 with one or more CPUs (not shown), this can result in significant efficiency and helps reduce the risk of damage to the motherboard, which can be proportional to the number of steps performed on the motherboard. To achieve these objectives, the innovative coupling agents 100, 200 may include one or more capture elements for catching and aligning the HX unit 20 to the coupling agent 100, 200. For example, in the embodiments shown, the topside 25 of the HX unit can include one or more magnets 120b and the encagement structure 100, 200 can comprise a ferrous material 120a suitable for being retained or otherwise acted on by a magnetic field corresponding to the one or more magnets 120b of the HX unit 20. For example, a magnet 120b can be positioned at one or more corners (e.g., diagonally opposed corners with housing fasteners 121 in other corners 26) of an upwardly facing surface 25 of the HX unit 20. At least the corners 145 of the coupling agent 100, 200 can comprise a magnetic or ferromagnetic material 120a such that the HX unit 20 and the coupling agent 100, 200 urge toward each other under a magnetic force. The magnetic force can be sufficient to bind the HX unit 20 and the coupling agent 100, 200 together in a subassembly so that they can be handled as a single unit, as during installation of the HX unit 20 in a system.

By providing a coupling agent 100, 200 that is an independent component or subassembly instead of retention elements 302 that are integrated on the HX unit 20, a single HX unit 20 design can be manufactured and used with a variety of heat generating components without needing to retool a housing for the HX unit as, for example, specified locations of mounting features on a motherboard differ between or among heat generating components. For example, one set of mounting hole locations can be specified in relation to one microprocessor and another, different set of mounting hole locations can be specified in relation to another microprocessor.

With innovations described herein, coupling agents 100, 200 can be configured to accommodate different mounting hole locations and allow a given HX unit 20 to be used to cooling a variety of microprocessors. For example, a family of coupling agents 100, 200 can define common HX unit engagement features (e.g., to matingly engage one HX unit design) and each coupling agent design in the family of coupling agents can comprise a set of retention elements 110 corresponding to 100, 200 a selected configuration (or set) of mounting hole locations, as with the embodiments shown in FIGS. 1 and 2.

Accordingly, a line of HX units 20 can be mated to any of a variety of configurations of retention elements 100, 200 on a mounting surface 60. The coupling agent 100, 200 is the only item that must be adapted to the particular configuration of retention elements on the mounting surface. The coupling agent 100, 200 may be constructed easily from inexpensive and simple materials, such as common metals and plastics, so customizing the coupling agent to a particular configuration of retention elements on a mounting surface is a more efficient option than customizing the housing or body of an HX unit to have integrated retention elements.

The coupling agent may be made by any number of manufacturing methods. For example, it may be made by stamping sheet metal to a particular shape. Or it could be made from injection-molded plastics with a ferrous or ferromagnetic portion.

Figure 1:
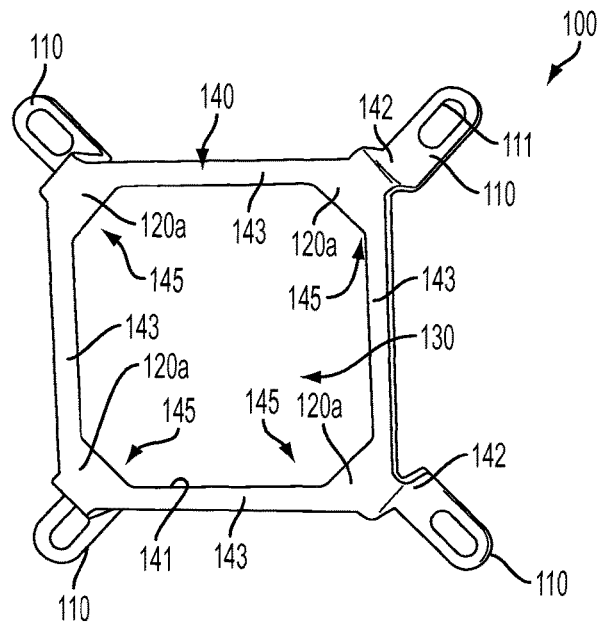
FIG. 1 shows an isometric view from above of a coupling agent for coupling a heat exchange unit to a mounting surface.

FIG. 2 shows a variation of the coupling agent of FIG. 1 wherein only two legs 142 and retention elements 110 are provided on the encagement structure. This embodiment can receive the same HX unit 20 as that shown in FIGS. 1, 3, and 5-6 but has retention elements arranged to match to a different mounting surface with a different arrangement of retention elements.

Figure 9:
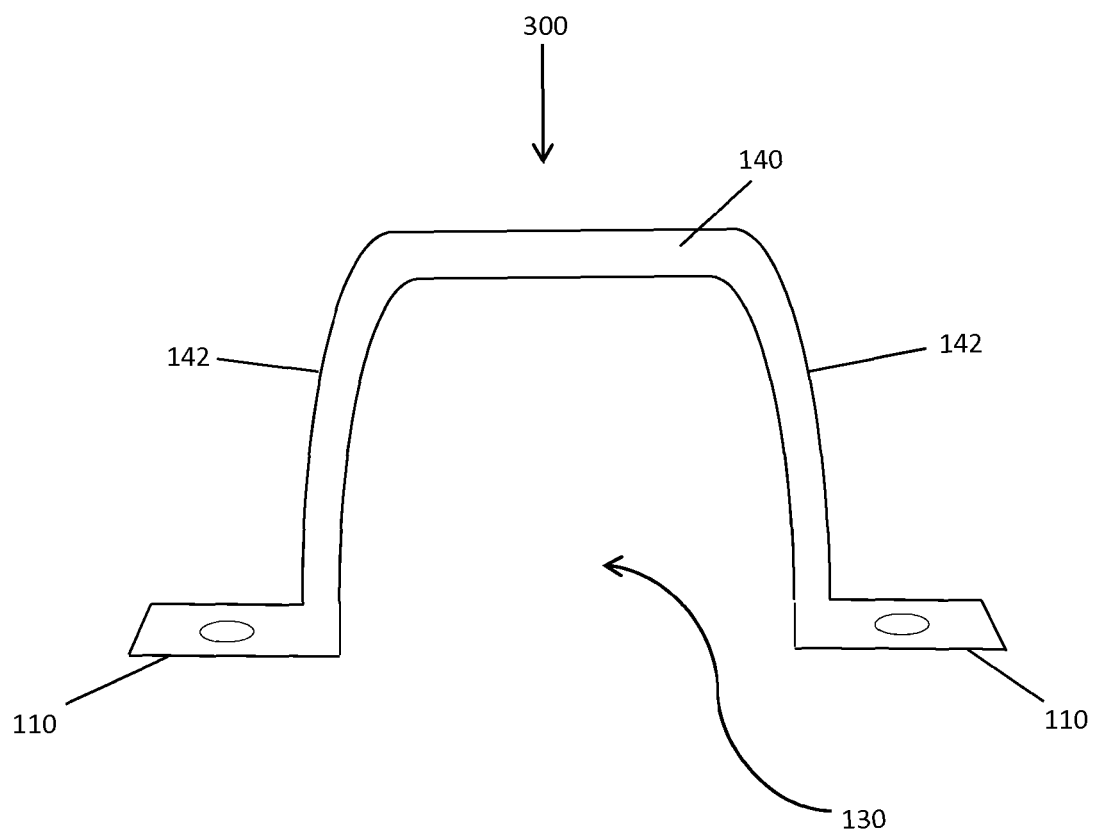
FIG. 9 shows a side perspective view of an alternative embodiment of a coupling agent for coupling the same predetermined heat exchange unit to a different mounting surface.

FIG. 9 shows a variation 300 of the coupling agent 100 of FIG. 1 wherein only two legs 142 with associated retention elements 110 are provided on an encagement structure. This embodiment can receive the same HX unit 20 as that shown in FIGS. 1, 3, 5-6 but has retention elements arranged to match to a different mounting surface with a different arrangement of retention elements. Further, this generally U-shaped embodiment shows that the coupling agent 300 need not engage the HX unit on all sides. As this embodiment shows, an engagement across the topside 25 and on two vertical sides may be sufficient. Similarly, an L-shaped embodiment (not shown) could engage an HX unit on just the topside and one vertical side. One leg of the "L" can engage or urge against an upwardly facing portion of the HX unit and the other leg of the "L" can engage or otherwise couple to the mounting surface.

OTHER EXEMPLARY EMBODIMENTS

The examples described above generally concern fluidic heat transfer systems configured to cool one or more electronic components, such as integrated circuits. Nonetheless, other applications for disclosed heat transfer systems and related coupling agents are contemplated, together with any attendant changes in configuration of the disclosed apparatus. Incorporating the principles disclosed herein, it is possible to provide a wide variety of systems configured to couple an HX unit to a subject of thermal exchange.

Directions and references (e.g., up, down, top, bottom, left, right, rearward, forward, etc.) may be used to facilitate discussion of the drawings but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or."

Moreover, all patent and non-patent literature cited herein is hereby incorporated by references in its entirety for all purposes.

The principles described above in connection with any particular example can be combined with the principles described in connection with any one or more of the other examples. Accordingly, this detailed description shall not be construed in a limiting sense, and following a review of this disclosure, those of ordinary skill in the art will appreciate the wide variety of fluid heat exchange systems that can be devised using the various concepts described herein. Moreover, those of ordinary skill in the art will appreciate that the exemplary embodiments disclosed herein can be adapted to various configurations without departing from the disclosed principles.

The previous description of the disclosed embodiments is provided to enable any person skilled in the art to make or use the disclosed innovations. Various modifications to those embodiments will be readily apparent to those skilled in the art, and the generic principles defined herein may be applied to other embodiments without departing from the spirit or scope of this disclosure. Thus, the claimed inventions are not intended to be limited to the embodiments shown herein, but are to be accorded the full scope consistent with the language of the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the elements of the claims. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

Thus, in view of the many possible embodiments to which the disclosed principles can be applied, it should be recognized that the above-described embodiments are only examples and should not be taken as limiting in scope. I therefore reserve all rights to the subject matter disclosed herein, including the right to claim all that comes within the scope and spirit of the following claims, as well as all aspects of any innovation shown or described herein.

The invention claimed is:

1. A heat exchange system comprising:
    a heat exchanger having a housing and a heat exchange surface configured to thermally couple to a subject of heat exchange, wherein the housing defines an outer surface spaced apart from the heat exchange surface;
    a magnetic element, a ferrous element, or both, positioned within the housing, such that a coupling agent having a complementary magnetic element, ferrous element, or both, can interact with the magnetic element, the ferrous element, or both, positioned within the housing; and
    a coupling agent configured to magnetically couple to the heat exchanger housing, wherein the coupling agent comprises a construct configured to couple the heat exchanger to a mounting surface and immobilize the heat exchanger in place over a subject of thermal exchange;
    wherein the construct comprises an encagement structure having a topside generally disposed in a horizontal plane and one or more vertical spacers downwardly extending from the topside, the topside and the vertical spacer(s) generally defining an area for receiving the housing, and a retention element disposed on the one or more vertical spacers for interacting with a corresponding retention element on a mounting surface; and
    wherein the topside of the coupling agent matingly engages the topside of the housing, such that the coupling agent being secured to the mounting surface via the retention elements immobilizes the heat exchanger.

2. A heat exchange system according to claim 1, wherein the magnetic element, the ferrous element, or both, positioned within the housing define a surface, and wherein at least a portion of the surface is exposed to the outer surface of the housing.

3. A heat exchange system according to claim 1, further comprising a coupling element configured to couple the heat exchanger to a substrate.

4. A heat exchange system according to claim 1, wherein the magnetic element, the ferrous element, or both, positioned within the housing comprises a magnet.

5. A heat exchange system according to claim 4, further comprising a coupling agent having a ferrous portion positioned to magnetically couple with the magnet.

6. A heat exchange system according to claim 5, wherein the magnet comprises a first magnet, wherein the heat exchange system further comprises a second magnet positioned within the housing of the heat exchanger, wherein the first magnet and the second magnet are positioned diagonally opposite each other relative to the housing, wherein the ferrous portion of the coupling agent comprises a first ferrous portion and a second ferrous portion positioned diagonally opposite each other relative to the coupling agent in an arrangement complementary to the positions of the first magnet and the second magnet, such that the first magnet and the first ferrous portion are magnetically coupleable with each other and such that the second magnet and the second ferrous portion are magnetically coupleable with each other so as to urge the coupling agent and the heat exchanger housing toward each other.

7. A heat exchange system according to claim 1, wherein the housing and the coupling agent define complementary surfaces configured to matingly engage with each other when the coupling agent and the heat exchange housing are magnetically coupled to each other.

8. A heat exchange system according to claim 7, wherein the coupling agent further comprises an integrated retention element configured to be fixedly coupled to a substrate.

9. A heat exchange system according to claim 8, wherein the coupling agent and the heat exchanger housing are configured such that a portion of the heat exchanger housing is positioned between the coupling agent and the substrate when the coupling agent is magnetically coupled to the heat exchanger housing and fixedly coupled to the substrate.

10. A heat exchange system according to claim 1 wherein the one or more vertical spacers comprises a plurality of vertical spacers, each with an associated retention element.

11. A heat exchange system according to claim 10 wherein the encagement structure comprises a topside framework defining an aperture to matingly receive a topside of the housing.

12. A heat exchange system according to claim 1 wherein the vertical spacers comprise legs spaced along the perimeter of the topside.

13. A heat exchange system according to claim 1 wherein the encagement structure has a generally square shape and has a footprint measuring between about 3 sq. inches and about 9 sq. inches.

14. A heat exchange system according to claim 1, wherein the mounting surface comprises a motherboard or other circuit board for a CPU.

15. A heat exchange system according to claim 1, wherein the coupling agent further comprises one or more magnetic or ferromagnetic elements positioned to align with and magnetically couple with the magnetic or ferromagnetic elements positioned within the housing.

16. A heat exchange system comprising:
 a heat exchanger having a housing and a heat exchange surface configured to thermally couple to a subject of heat exchange, wherein the housing defines an outer surface spaced apart from the heat exchange surface;
 a magnetic element, a ferrous element, or both, positioned within the housing and defining a surface, wherein at least a portion of the surface is exposed to the outer surface of the housing;
 an encagement structure configured to couple the heat exchanger to a substrate, wherein the encagement structure comprises a magnetic element, a ferrous portion, or both positioned in a complementary arrangement relative to the magnetic element, the ferrous element, or both, within the housing, wherein the encagement structure defines an aperture and wherein the housing defines a complementarily shaped extension configured to extend through the aperture and to matingly engage the encagement structure such that the magnetic element, the ferrous element, or both, within the housing can magnetically couple with the magnetic element, the ferrous element, or both, of the encagement structure, wherein the encagement structure further comprises a retention element extending from the encagement structure and defining an aperture through which a fastener can extend, such that the fastener can engage a corresponding fastener element associated with a substrate so as to retain the encagement structure to the substrate with at least a portion of the heat exchanger housing positioned therebetween in a fixed attachment.

* * * * *